United States Patent
Lv

(10) Patent No.: US 10,672,355 B2
(45) Date of Patent: Jun. 2, 2020

(54) METHOD OF IMPROVING A HIGH CURRENT OF GOA CIRCUIT WHEN POWER ON

(71) Applicant: SHENZHEN CHINA STAR OPTOELECTRONICS SEMICONDUCTOR DISPLAY TECHNOLOGY CO., LTD., Guangdong (CN)

(72) Inventor: Xiaowen Lv, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/741,976

(22) PCT Filed: Nov. 23, 2017

(86) PCT No.: PCT/CN2017/112573
§ 371 (c)(1),
(2) Date: Oct. 19, 2018

(87) PCT Pub. No.: WO2019/095418
PCT Pub. Date: May 23, 2019

(65) Prior Publication Data
US 2019/0147819 A1 May 16, 2019

(30) Foreign Application Priority Data
Nov. 16, 2017 (CN) .......................... 2017 1 1137680

(51) Int. Cl.
G09G 3/36 (2006.01)
G11C 19/28 (2006.01)
G09G 3/20 (2006.01)

(52) U.S. Cl.
CPC ............. *G09G 3/3677* (2013.01); *G09G 3/20* (2013.01); *G11C 19/28* (2013.01);
(Continued)

(58) Field of Classification Search
CPC .......... G09G 3/3677; G09G 2330/021; G09G 2310/08; G09G 2310/0286; G09G 3/20;
(Continued)

(56) References Cited

U.S. PATENT DOCUMENTS

2018/0151148 A1* 5/2018 Wu ...................... G11C 19/184

* cited by examiner

*Primary Examiner* — Charles V Hicks
(74) *Attorney, Agent, or Firm* — Hemisphere Law, PLLC; Zhigang Ma

(57) ABSTRACT

A method of improving a high current of GOA circuit when power on is provided, including: determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal, a first clock signal and a second clock signal are disposed on each of GOA structure units; and pulling up a voltage of the first clock signal and the second clock signal to a predetermined value for a certain time at an abnormal power off moment to discharge the pre-charge signal when detecting the GOA circuit abnormally power off. By practice of the disclosure, the pre-charge signal of GOA structure unit could discharge when the GOA circuit abnormally power off to reduce the high current probability.

14 Claims, 3 Drawing Sheets determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time. — S11 pulling up a voltage of the first clock signal and a voltage of the second clock signal connected to the pull-down holding circuit respectively to a predetermined value for a certain time at an abnormal power off moment to discharge the pre-charge signal when detecting the GOA circuit abnormally power off. — S12

(52) U.S. Cl.
CPC ........... *G09G 2310/0267* (2013.01); *G09G 2310/0286* (2013.01); *G09G 2310/06* (2013.01); *G09G 2310/08* (2013.01); *G09G 2330/021* (2013.01)

(58) Field of Classification Search
CPC ....... G09G 2310/0267; G09G 2310/06; G11C 19/28
See application file for complete search history.

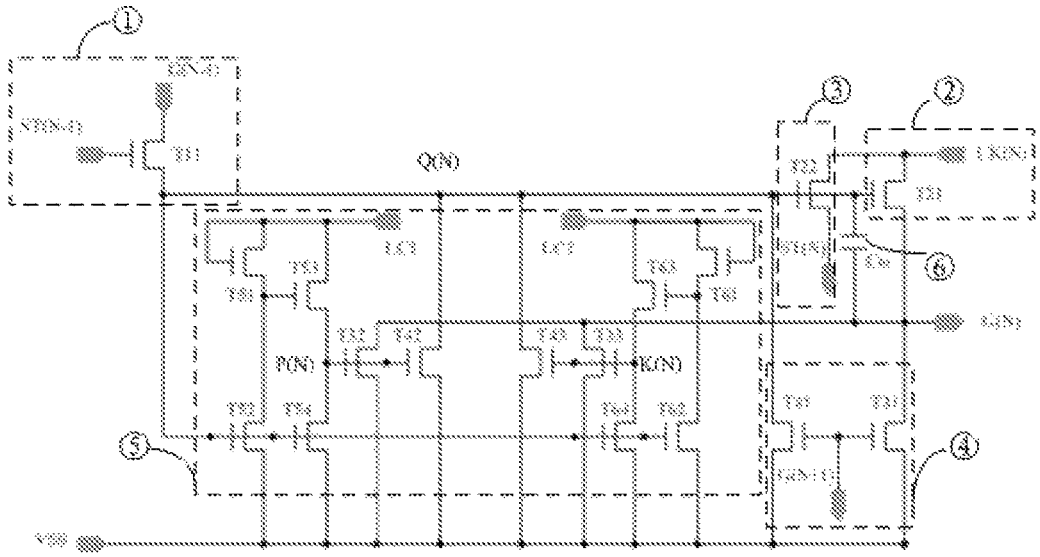

FIG. 1 determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time. — S11 pulling up a voltage of the first clock signal and a voltage of the second clock signal connected to the pull-down holding circuit respectively to a predetermined value for a certain time at an abnormal power off moment to discharge the pre-charge signal when detecting the GOA circuit abnormally power off. — S12

FIG. 2 determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time

S21 verifying two pull-down holding sub-circuits of the pull-down holding circuit, a first inverter and a second inverter corresponding to the two pull-down holding sub-circuits

S22 adjusting an original size ratio of the first thin film transistor to the fourth thin film transistor to a predetermined size ratio to discharge the pre-charge signal via the first circuit point in a non-operating state of the pull-down holding sub-circuit with the first inverter; and/ or
adjusting an original size ratio of the seventh thin film transistor to the tenth thin film transistor to a predetermined size ratio to discharge the pre-charge signal via the second circuit point in a non-operating state of the pull-down holding sub-circuit with the second inverter

METHOD OF IMPROVING A HIGH CURRENT OF GOA CIRCUIT WHEN POWER ON

RELATED APPLICATIONS

The present application is a National Phase of International Application Number PCT/CN2017/112573, filed Nov. 23, 2017, and claims the priority of China Application No. 201711137680.1, filed Nov. 16, 2017.

FIELD OF THE DISCLOSURE

The disclosure relates to a liquid crystal display technical field, and more particularly to a method of improving a high current of GOA (gate driver on array) circuit when power on.

BACKGROUND

Liquid crystal displays (LCD) which have advantages of low radiation, compact in size and low energy consumption, are gradually replacing conventional cathode ray tube displays, therefore they are widely used in electronic products such as laptops, personal digital assistants (PDA), flat panel televisions or mobile phones, etc. Conventional liquid crystal displays employ external driver chips to drive the pixels on the panels to display images or pictures. In order to decrease the number of components used and to reduce manufacturing costs, in the recent years, it is gradually developed to have the structures of drive circuits integrated directly on the display panels; for example, the gate on array (GOA) technology is applied to integrate gate driver circuits on a liquid crystal panel.

The gate on array (GOA) technology compares to the conventional chip on flex/film (COF) technology, the manufacturing cost could be reduced, and the bonding process of COF on the gate side could be omitted, so the production capacity could be improved. Therefore, the gate on array (GOA) technology is important for the development of liquid crystal panel in the future.

As shown in FIG. 1, an GOA circuit includes plurality of GOA structure units in cascade, each of GOA structure units drives a corresponding scan line. Each of GOA structure units includes a pull-up control circuit ①, a pull-up circuit ②, a transfer circuit ③, a pull-down circuit ④, a pull-down holding circuit ⑤ and a bootstrapping capacitor ⑥ for boosting the voltage. Wherein, the pull-up control circuit ① is configured to control the turn-on time of the pull-up circuit ② to pre-charge a pre-charge signal Q(N), and connects to the transfer signal transferred by the previous stage GOA structure unit and the gate output signal, the pull-up circuit ②; is configured to pull up the voltage of the gate output signal to control the gate to turn on, the transfer circuit ③ is configured to control the signal of the next stage GOA structure unit to turn on or turn off, the pull-down circuit ④ is configured to pull down the voltage of Q(N) and G(N) to VSS at the first time to turn off the signal of G(N), the pull-down holding circuit ⑤ is configured to hold the voltage of Q(N) and G(N) on VSS (i.e. negative voltage) and generally has two pull-down holding modules to work alternatively, the bootstrapping capacitor ⑥ is configured to boost the voltage of Q(N) for the second time for improving the output of G(N) of the pull-up circuit.

However, when the GOA circuit abnormally power off, some GOA structure units cannot release the charge of the pre-charge signal in time, as the GOA circuit is power on and power off too fast, since the charge of the pre-charge signal of the previous stage GOA structure unit cannot be released, the gate output signal of the previous stage GOA structure unit will be abnormally high current, so the overcurrent protection will be activated and the GOA circuit cannot be restarted or directly burn the GOA circuit.

SUMMARY

A technical problem to be solved by the disclosure is to provide a method of improving a high current of GOA circuit when power on, so the pre-charge signal of GOA structure unit could discharge when the GOA circuit abnormally power off to reduce the high current probability.

To achieve the above object, according to one aspect, the embodiment of the disclosure provides a method of improving a high current of GOA circuit when power on, including:

step 11: determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time; and step 12: pulling up a voltage of the first clock signal and a voltage of the second clock signal connected to the pull-down holding circuit respectively to a predetermined value for a certain time at an abnormal power off moment to discharge the pre-charge signal when detecting the GOA circuit abnormally power off.

In an embodiment, the method of improving a high current of GOA circuit when power on further includes a step between step 11 and step 12:

verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, an eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter.

In an embodiment, the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2.

In an embodiment, the method of improving a high current of GOA circuit when power on further includes:

restoring an original voltage of the first clock signal and the second signal before restart the GOA circuit.

In an embodiment, the predetermined value is 40V.

According to another aspect, the embodiment of the disclosure provides a method of improving a high current of GOA circuit when power on, including:

step 21: determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time; step 22: verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, a eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second dock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

step 23: adjusting an original size ratio of the first thin film transistor to the fourth thin film transistor to a predetermined size ratio to discharge the pre-charge signal via the first circuit point in a non-operating state of the pull-down holding sub-circuit with the first inverter and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter.

In an embodiment, the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2.

In an embodiment, the method of improving a high current of GOA circuit when power on further includes:

pulling up a voltage of the first clock signal and a voltage of the second clock signal connected to the pull-down holding circuit respectively to a predetermined value for a certain time at an abnormal power off moment to discharge the pre-charge signal when detecting the GOA circuit abnormally power off.

In an embodiment, the predetermined value is 40V.

In an embodiment, the method of improving a high current of GOA circuit when power on further includes:

restoring an original voltage of the first clock signal and the second signal before restart the GOA circuit.

According to another aspect, the embodiment of the disclosure provides a method of improving a high current of GOA circuit when power on, including:

determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time;

verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, a eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter;

wherein, the method of improving a high current of GOA circuit when power on further includes:

pulling up a voltage of the first clock signal and a voltage of the second clock signal connected to the pull-down holding circuit respectively to a predetermined value for a certain time at an abnormal power off moment to discharge the pre-charge signal when detecting the GOA circuit abnormally power off.

In an embodiment, the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2.

In an embodiment, the predetermined value is 40V.

In an embodiment, the method of improving a high current of GOA circuit when power on further includes:

restoring an original voltage of the first clock signal and the second signal before restart the GOA circuit.

In summary, the method of improving a high current of GOA circuit when power on provided by the embodiments of the disclosure, by pulling up a voltage of the first clock signal and a voltage of the second clock signal connected to the pull-down holding circuit respectively to a predetermined value for a certain time at an abnormal power off moment could discharge the pre-charge signal, so the high current probability could be reduced, and the stability and the safety of the GOA circuit could be increased.

The method of improving a high current of GOA circuit when power on provided by the embodiments of the disclosure, by adjusting an original size ratio of the first thin film transistor to the fourth thin film transistor to a predetermined size ratio and/or adjusting an original size ratio of the seventh thin film transistor to the tenth thin film transistor to a predetermined size ratio could discharge the pre-charge signal, so the high current probability could be reduced, and the stability and the safety of the GOA circuit could be increased.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures:

FIG. 1 is a schematic circuit diagram of a Nth stage GOA structure unit of the conventional GOA circuit;

FIG. 2 is a flow chart diagram of a method of improving a high current of GOA circuit when power on according to Embodiment 1 of the disclosure;

FIG. 4 is a flow chart diagram of a method of improving a high current of GOA circuit when power on according to Embodiment 2 of the disclosure.

DETAILED DESCRIPTION OF PREFERRED EMBODIMENTS

Figure 3:
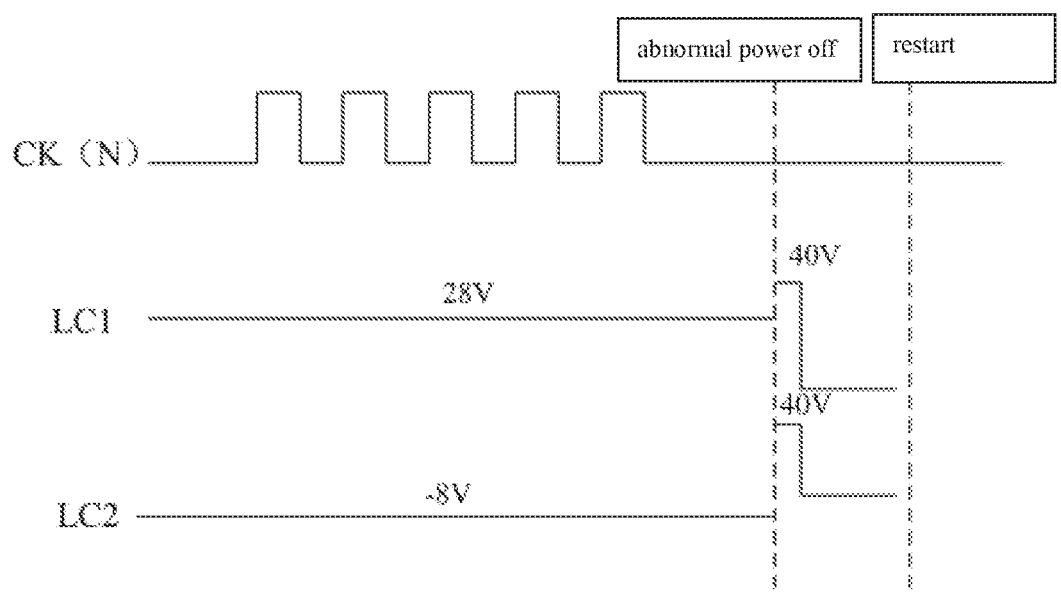
FIG. 3 is a timing diagram of an application of a Nth stage GOA structure unit of a method of improving a high current of GOA circuit when power on according to Embodiment 1 of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

The inventors have found that the GOA circuit direct current low voltage signal low voltage signal VSS is usually pulled high to discharge the entire GOA circuit in order to effectively discharge the pre-charge signal of the single-stage GOA structure unit when the GOA circuit abnormally power off. However, it takes a certain amount of time for the direct current low voltage signal VSS to be pulled from the low level to the high level. Due to the limitation of the GOA circuit system, the time when the direct current low voltage signal VSS is pulled to the high level needs to be specially designed, but this design may not be supported by the GOA circuit system, so it's difficult to achieve.

Therefore, a method of improving a high current of GOA circuit when power on is provided. As shown in FIG. 2, the method of improving a high current of GOA circuit when power on according to Embodiment 1 of the disclosure includes:

step 11: determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time; and step 12: pulling up a voltage of the first dock signal and a voltage of the second clock signal connected to the pull-down holding circuit respectively to a predetermined value for a certain time at an abnormal power off moment to discharge the pre-charge signal when detecting the GOA circuit abnormally power off.

Specifically, in step 11, determining a GOA circuit, wherein the GOA circuit includes a plurality of GOA structure units in cascade, and each of GOA structure units outputs a scan signal to a corresponding row pixel units in the display area on the display panel according to the Nth stage GOA structure unit, wherein N is a positive integer. For the convenience of description, the Nth stage GOA structure unit of FIG. 1 is taken as an example to illustrate the single-stage GOA structure unit.

the Nth stage GOA structure unit includes a pull-up control circuit ①, a pull-up circuit ②, a transfer circuit ③, a pull-down circuit ④, a pull-down holding circuit ⑤ and a bootstrapping capacitor ⑥ for boosting the voltage. Wherein, a pre-charge signal Q(N) is between the pull-up control circuit ① and the pull-up circuit ②, and the pull-down holding circuit ⑤ has two pull-down holding sub-circuits. Each pull-down holding sub-circuit includes an inverter to connect to the corresponding clock signal, for example, a first inverter connects to a first clock signal LC1, and a second inverter connects to a second clock signal LC2, and a voltage of the first clock signal LC1 and a voltage of the second clock signal LC2 is different in each same moment, so the two pull-down holding sub-circuits could work alternatively.

In step 12, when detecting the GOA circuit abnormally power off, pull up a voltage of the first clock signal and a voltage of the second clock signal connected to the pull-down holding circuit respectively to a predetermined value for a certain time at an abnormal power off moment to discharge the pre-charge signal. Certainly, if the voltages of the first clock signal and the second clock signal corresponding to the pull-down holding circuits in each single-stage GOA structure unit in the determined GOA circuit are pulled up to a predetermined value for a certain time, so the discharge effect of the pre-charge signal of each single-stage GOA structure unit is best. Wherein, the predetermined value is 40V or higher, just higher than the highest voltage of the first clock signal and the second clock signal of the single-stage GOA structure unit.

In an embodiment, as shown in FIG. 3, the working voltage of the first clock signal of the Nth stage GOA structure unit is maintaining at 28V, and the working voltage of the second clock signal of the Nth stage GOA structure unit is maintaining at −8V. When the GOA circuit abnormally power off, pull up a voltage of the first clock signal and a voltage of the second clock signal connected to the pull-down holding circuit respectively to 40V for a certain time at an abnormal power off moment to discharge the pre-charge signal. Wherein, when the working voltage of the first clock signal of the Nth stage GOA structure unit is 28V or 8V, the working voltage of the second clock signal of the Nth stage GOA structure unit is −8V; or when the working voltage of the first clock signal of the Nth stage GOA structure unit is −8V, the working voltage of the second clock signal of the Nth stage GOA structure unit is 28V or 8V.

In order to ensure that the determined GOA circuit can resume its original state after being discharged, the method further includes:

restoring an original voltage of the first clock signal and the second signal before restart the GOA circuit.

In Embodiment 1 of the disclosure, before the GOA circuit abnormally power off (i.e. normally working), the pre-charge signal also could discharge via the pull-down holding circuit, even the GOA circuit abnormally power off, the high current probability could be reduced. Therefore, the method of improving a high current of GOA circuit when power on further includes a step between step 11 and step 12:

verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, an eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter.

It should be noted that the size of the transistor is W (width)/L (length), the length L of the transistor for general semiconductor is a certain value, so the size ratio of the transistors is the width ratio. W (width)/L (length) represents the ability of thin film transistor to conduct current, when W (width)/L (length) is larger, the current is larger, which means the resistance is smaller. Adjusting the size (width) ratio of two thin film transistors is adjusting the voltage distribution of two thin film transistors, in order to reduce the voltages of the first circuit point and the second circuit point, so the pre-charge signal could discharge easily via the first circuit point and/or the second circuit point.

In Embodiment 1 of the disclosure, the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2 or greater.

Take the Nth stage GOA structure unit for example, the pull-down holding circuit S, includes the first inverter and the second inverter. The first inverter includes the first thin film transistor T53, the second thin film transistor T51, the third thin film transistor T52 and the fourth thin film transistor T54. The second inverter includes the seventh thin film transistor T63, the eighth thin film transistor T61, the ninth thin film transistor T62 and the tenth thin film transistor T64.

The drain of the first thin film transistor T53 connects to the first clock signal LC1, the source of the first thin film transistor T53 connects to the first circuit point P(N), the drain and the gate of the second thin film transistor T51 connect to each other, the drain and the gate of the second thin film transistor T51 connect to the first clock signal LC1, the source of the second thin film transistor T51 connects to the gate of the first thin film transistor T53, the drain of the third thin film transistor T52 connects to the source of the second thin film transistor T51, the gate of the third thin film transistor T52 connects to the pre-charge signal Q(N), the source of the third thin film transistor T52 connects to the direct current low voltage signal VSS, the drain of the fourth thin film transistor T54 connects to the first circuit point P(N), the gate of the fourth thin film transistor T54 connects to the pre-charge signal Q(N), and the source of the fourth thin film transistor T54 connects to the direct current low voltage signal VSS. The original size ratio of the first thin film transistor T53 to the fourth thin film transistor T54 is 1:5. The predetermined size ratio of the first thin film transistor T53 to the fourth thin film transistor T54 is 1:2. Adjust the original size ratio of the first thin film transistor T53 to the fourth thin film transistor T54 to the predetermined size ratio to discharge the pre-charge signal Q(N) via the first circuit point P(N) in a non-operating state of the pull-down holding sub-circuit with the first inverter, i.e. the first clock signal LC1 is in a low voltage state.

The drain of the seventh thin film transistor T63 connects to the second clock signal LC2, the source of the seventh thin film transistor T63 connects to the second circuit point K(N), the drain and the gate of the eighth thin film transistor T61 connect to each other, the drain and the gate of the eighth thin film transistor T61 connect to the second clock signal LC2, the source of the eighth thin film transistor T61 connects to the gate of the seventh thin film transistor T63, the drain of the ninth thin film transistor T62 connects to the source of the eighth thin film transistor T61, the gate of the ninth thin film transistor T62 connects to the pre-charge signal Q(N), the source of the ninth thin film transistor T62 connects to the direct current low voltage signal VSS, the drain of the tenth thin film transistor T64 connects to the second circuit point K(N), the gate of the tenth thin film transistor T64 connects to the pre-charge signal Q(N), and the source of the tenth thin film transistor T64 connects to the direct current low voltage signal VSS. The original size ratio of the seventh thin film transistor T63 to the tenth thin film transistor T64 is 1:7. The predetermined size ratio of the seventh thin film transistor T63 to the tenth thin film transistor T64 is 1:2. Adjust the original size ratio of the seventh thin film transistor T63 to the tenth thin film transistor T64 to the predetermined size ratio to discharge the pre-charge signal Q(N) via the second circuit point K(N) in a non-operating state of the pull-down holding sub-circuit with the second inverter, i.e. the second dock signal LC2 is in a low voltage state.

As shown in FIG. 4, Embodiment 2 of the disclosure provides another method of improving a high current of GOA circuit when power on, including:

step 21: determining a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time;

step 22: verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, a eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

step 23: adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter.

Specifically, in step 21, determining a GOA circuit, wherein the GOA circuit includes a plurality of GOA structure units in cascade, and each of GOA structure units outputs a scan signal to a corresponding row pixel units in the display area on the display panel according to the Nth stage GOA structure unit, wherein N is a positive integer. For the convenience of description, the Nth stage GOA structure unit of FIG. 1 is taken as an example to illustrate the single-stage GOA structure unit.

the Nth stage GOA structure unit includes a pull-up control circuit ①, a pull-up circuit ②, a transfer circuit ③, a pull-down circuit ④, a pull-down holding circuit ⑤ and a bootstrapping capacitor ⑥ for boosting the voltage. Wherein, a pre-charge signal Q(N) is between the pull-up control circuit ① and the pull-up circuit ②, and the pull-down holding circuit ⑤ has two pull-down holding sub-circuits. Each pull-down holding sub-circuit includes an inverter to connect to the corresponding clock signal, for example, a first inverter connects to a first dock signal LC1, and a second inverter connects to a second clock signal LC2, and a voltage of the first clock signal LC1 and a voltage of the second dock signal LC2 is different in each same moment, so the two pull-down holding sub-circuits could work alternatively.

In step 22, verifying two pull-down holding sub-circuits of the pull-down holding circuit, a first inverter and a second inverter corresponding to the two pull-down holding sub-circuits.

Take the Nth stage GOA structure unit for example, the pull-down holding circuit ⑤ includes the first inverter and the second inverter. The first inverter includes the first thin film transistor T53, the second thin film transistor T51, the third thin film transistor T52 and the fourth thin film transistor T54. The second inverter includes the seventh thin film transistor T63, the eighth thin film transistor T61, the ninth thin film transistor T62 and the tenth thin film transistor T64.

The drain of the first thin film transistor T53 connects to the first dock signal LC1, the source of the first thin film transistor T53 connects to the first circuit point P(N), the drain and the gate of the second thin film transistor T51 connect to each other, the drain and the gate of the second thin film transistor T51 connect to the first clock signal LC1, the source of the second thin film transistor T51 connects to the gate of the first thin film transistor T53, the drain of the third thin film transistor T52 connects to the source of the second thin film transistor T51, the gate of the third thin film transistor T52 connects to the pre-charge signal Q(N), the source of the third thin film transistor T52 connects to the direct current low voltage signal VSS, the drain of the fourth thin film transistor T54 connects to the first circuit point P(N), the gate of the fourth thin film transistor T54 connects to the pre-charge signal Q(N), and the source of the fourth thin film transistor T54 connects to the direct current low voltage signal VSS.

The drain of the seventh thin film transistor T63 connects to the second clock signal LC2, the source of the seventh thin film transistor T63 connects to the second circuit point K(N), the drain and the gate of the eighth thin film transistor T61 connect to each other, the drain and the gate of the eighth thin film transistor T61 connect to the second clock signal LC2, the source of the eighth thin film transistor T61 connects to the gate of the seventh thin film transistor T63, the drain of the ninth thin film transistor T62 connects to the source of the eighth thin film transistor T61, the gate of the ninth thin film transistor T62 connects to the pre-charge signal Q(N), the source of the ninth thin film transistor T62 connects to the direct current low voltage signal VSS, the drain of the tenth thin film transistor T64 connects to the second circuit point K(N), the gate of the tenth thin film transistor T64 connects to the pre-charge signal Q(N), and the source of the tenth thin film transistor T64 connects to the direct current low voltage signal VSS.

In step 23, before the GOA circuit abnormally power off (i.e. normally working), the pre-charge signal also could discharge via the pull-down holding circuit, even the GOA circuit abnormally power off, the high current probability could be reduced. Adjust an original size ratio of the first thin film transistor to the fourth thin film transistor to a predetermined size ratio to discharge the pre-charge signal via the first circuit point of the pull-down holding sub-circuit; and/or adjust an original size ratio of the seventh thin film transistor to the tenth thin film transistor to a predetermined size ratio to discharge the pre-charge signal via the second circuit point of the pull-down holding sub-circuit. Even the GOA circuit is in an operating state, the pre-charge signal of each single stage GOA structure unit could discharge via the first circuit point and/or the second circuit point to reduce the charge when the GOA circuit power off. It should be noted that the GOA structure units discharge when one of the two pull-down holding sub-circuits is in the non-operating state, the two pull-down holding sub-circuits work alternatively, so the GOA structure units could discharge continuously.

It should be noted that the size of the transistor is W (width)/L (length), the length L of the transistor for general semiconductor is a certain value, so the size ratio of the transistors is the width ratio. W (width)/L (length) represents the ability of thin film transistor to conduct current, when W (width)/L (length) is larger, the current is larger, which means the resistance is smaller. Adjusting the size (width) ratio of two thin film transistors is adjusting the voltage distribution of two thin film transistors, in order to reduce the voltages of the first circuit point and the second circuit point, so the pre-charge signal could discharge easily via the first circuit point and/or the second circuit point.

In Embodiment 2 of the disclosure, the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2 or greater.

Take the Nth stage GOA structure unit for example, the original size ratio of the first thin film transistor T53 to the fourth thin film transistor T54 is 1:5. The predetermined size ratio of the first thin film transistor T53 to the fourth thin film transistor T54 is 1:2. Adjust the original size ratio of the first thin film transistor T53 to the fourth thin film transistor T54 to the predetermined size ratio to discharge the pre-charge signal Q(N) via the first circuit point P(N) in a non-operating state of the pull-down holding sub-circuit with the first inverter, i.e. the first clock signal LC1 is in a low voltage state.

The drain of the seventh thin film transistor T63 connects to the second clock signal LC2, the source of the seventh thin film transistor T63 connects to the second circuit point K(N), the drain and the gate of the eighth thin film transistor T61 connect to each other, the drain and the gate of the eighth thin film transistor T61 connect to the second clock signal LC2, the source of the eighth thin film transistor T61 connects to the gate of the seventh thin film transistor T63, the drain of the ninth thin film transistor T62 connects to the source of the eighth thin film transistor T61, the gate of the ninth thin film transistor T62 connects to the pre-charge signal Q(N), the source of the ninth thin film transistor T62 connects to the direct current low voltage signal VSS, the drain of the tenth thin film transistor T64 connects to the second circuit point K(N), the gate of the tenth thin film transistor T64 connects to the pre-charge signal Q(N), and the source of the tenth thin film transistor T64 connects to the direct current low voltage signal VSS. The original size ratio of the seventh thin film transistor T63 to the tenth thin film transistor T64 is 1:7. The predetermined size ratio of the seventh thin film transistor T63 to the tenth thin film transistor T64 is 1:2. Adjust the original size ratio of the seventh thin film transistor T63 to the tenth thin film transistor T64 to the predetermined size ratio to discharge the pre-charge signal Q(N) via the second circuit point K(N) in a non-operating state of the pull-down holding sub-circuit with the second inverter, i.e. the second clock signal LC2 is in a low voltage state.

When the GOA circuit abnormally power off, and the charge of the pre-charge signal of the previous stage GOA structure unit cannot be released, to avoid the overcurrent protection will be activated and the GOA circuit cannot be restarted or directly burn the GOA circuit, the method of improving a high current of GOA circuit when power on further includes:

pulling up a voltage of the first clock signal and a voltage of the second clock signal connected to the pull-down holding circuit respectively to a predetermined value for a certain time at an abnormal power off moment to discharge the pre-charge signal when detecting the GOA circuit abnormally power off. Wherein, the predetermined value is 40V or higher, just higher than the highest voltage of the first clock signal and the second clock signal of the single-stage GOA structure unit.

Take the Nth stage GOA structure unit for example, the working voltage of the first clock signal LC1 of the Nth stage GOA structure unit is maintaining at 28V, and the working voltage of the second clock signal LC2 of the Nth stage GOA structure unit is maintaining at −8V. When the GOA circuit abnormally power off, pull up a voltage of the first clock signal LC1 and a voltage of the second clock signal LC2 connected to the pull-down holding circuit respectively to 40V for a certain time at an abnormal power off moment to discharge the pre-charge signal Q(N). Wherein, when the working voltage of the first clock signal LC1 of the Nth stage GOA structure unit is 28V or 8V, the working voltage of the second clock signal LC2 of the Nth stage GOA structure unit is −8V; or when the working voltage of the first clock signal LC1 of the Nth stage GOA structure unit is −8V, the working voltage of the second clock signal LC2 of the Nth stage GOA structure unit is 28V or 8V.

In order to ensure that the determined GOA circuit can resume its original state after being discharged, the method further includes:

restoring an original voltage of the first clock signal and the second signal before restart the GOA circuit.

In summary, the method of improving a high current of GOA circuit when power on provided by the embodiments of the disclosure, by pulling up a voltage of the first clock signal and a voltage of the second clock signal connected to the pull-down holding circuit respectively to a predetermined value for a certain time at an abnormal power off moment could discharge the pre-charge signal, so the high current probability could be reduced, and the stability and the safety of the GOA circuit could be increased.

The method of improving a high current of GOA circuit when power on provided by the embodiments of the disclosure, by adjusting an original size ratio of the first thin film transistor to the fourth thin film transistor to a predetermined size ratio and/or adjusting an original size ratio of the seventh thin film transistor to the tenth thin film transistor to a predetermined size ratio could discharge the pre-charge signal, so the high current probability could be reduced, and the stability and the safety of the GOA circuit could be increased.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A method of improving a high current of GOA circuit comprising:

step 11: comprising a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time; and step 12: pulling up a voltage of the first clock signal and a voltage of the second clock signal connected to the pull-down holding circuit respectively to a predetermined value for a certain time to discharge the pre-charge signal when detecting the GOA circuit power being turned off.

2. The method of improving a high current of GOA circuit according to claim 1, wherein the step 11 further comprises:

verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, a eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter.

3. The method of improving a high current of GOA circuit according to claim 2, wherein the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2.

4. The method of improving a high current of GOA circuit according to claim 1, further comprising:

restoring an original voltage of the first clock signal and the second signal before restart the GOA circuit.

5. The method of improving a high current of GOA circuit according to claim 1, wherein the predetermined value is 40V.

6. A method of improving a high current of GOA circuit, comprising:

step 21: comprising a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time;

step 22: verifying two pull-down holding sub-circuits of the pull-down holding circuit, a first inverter and a second inverter corresponding to the two pull-down holding sub-circuits;

wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;

wherein the second inverter includes a seventh thin film transistor, a eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;

step 23: adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or adjusting an original size ratio of the seventh thin film transistor to the tenth thin film transistor to a predetermined size ratio to discharge the pre-charge signal via the second circuit point in a non-operating state of the pull-down holding sub-circuit with the second inverter.

7. The method of improving a high current of GOA circuit according to claim 6, wherein the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2.

8. The method of improving a high current of GOA circuit according to claim 7, further comprising:
pulling up a voltage of the first clock signal and a voltage of the second clock signal connected to the pull-down holding circuit respectively to a predetermined value for a certain time to discharge the pre-charge signal when detecting the GOA circuit power being turned off.

9. The method of improving a high current of GOA circuit according to claim 8, wherein the predetermined value is 40V.

10. The method of improving a high current of GOA circuit according to claim 8, further comprising:
restoring an original voltage of the first clock signal and the second signal before restart the GOA circuit.

11. A method of improving a high current of GOA circuit, comprising:
comprising a GOA circuit, wherein the GOA circuit includes a plurality of GOA structure units in cascade, each of GOA structure units includes a pull-up control circuit, a pull-up circuit, a transfer circuit, a pull-down circuit, a pull-down holding circuit and a bootstrapping capacitor, and a pre-charge signal is disposed on each of GOA structure units, a first clock signal and a second clock signal connect to the pull-down holding circuit and respectively have different voltages at a same time;
verifying two pull-down holding sub-circuits of the pull-down holding circuit, a first inverter and a second inverter corresponding to the two pull-down holding sub-circuits;
wherein the first inverter includes a first thin film transistor, a second thin film transistor, a third thin film transistor and a fourth thin film transistor, a drain of the first thin film transistor connects to the first clock signal, a source of the first thin film transistor connects to a first circuit point, a drain and a gate of the second thin film transistor connect to each other, the drain and the gate of the second thin film transistor connect to the first clock signal, a source of the second thin film transistor connects to a gate of the first thin film transistor, a drain of the third thin film transistor connects to the source of the second thin film transistor, a gate of the third thin film transistor connects to the pre-charge signal, a source of the third thin film transistor connects to a direct current low voltage signal, a drain of the fourth thin film transistor connects to the first circuit point, a gate of the fourth thin film transistor connects to the pre-charge signal, and a source of the fourth thin film transistor connects to the direct current low voltage signal;
wherein the second inverter includes a seventh thin film transistor, a eighth thin film transistor, a ninth thin film transistor and a tenth thin film transistor, a drain of the seventh thin film transistor connects to the second clock signal, a source of the seventh thin film transistor connects to a second circuit point, a drain and a gate of the eighth thin film transistor connect to each other, the drain and the gate of the eighth thin film transistor connect to the second clock signal, a source of the eighth thin film transistor connects to a gate of the seventh thin film transistor, a drain of the ninth thin film transistor connects to the source of the eighth thin film transistor, a gate of the ninth thin film transistor connects to the pre-charge signal, a source of the ninth thin film transistor connects to the direct current low voltage signal, a drain of the tenth thin film transistor connects to the second circuit point, a gate of the tenth thin film transistor connects to the pre-charge signal, and a source of the tenth thin film transistor connects to the direct current low voltage signal;
adjusting an original size ratio of the first thin film transistor to the fourth thin film transistor to a predetermined size ratio to discharge the pre-charge signal via the first circuit point in a non-operating state of the pull-down holding sub-circuit with the first inverter; and/or
adjusting an original size ratio of the seventh thin film transistor to the tenth thin film transistor to a predetermined size ratio to discharge the pre-charge signal via the second circuit point in a non-operating state of the pull-down holding sub-circuit with the second inverter;
wherein, the method of improving a high current of GOA circuit further comprises:
pulling up a voltage of the first clock signal and a voltage of the second clock signal connected to the pull-down holding circuit respectively to a predetermined value for a certain time to discharge the pre-charge signal when detecting the GOA circuit power being turned off.

12. The method of improving a high current of GOA circuit according to claim 11, wherein the original size ratio of the first thin film transistor to the fourth thin film transistor is 1:5 or 1:7, the original size ratio of the seventh thin film transistor to the tenth thin film transistor is 1:5 or 1:7, and the predetermined size ratio is 1:2.

13. The method of improving a high current of GOA circuit according to claim 12, wherein the predetermined value is 40V.

14. The method of improving a high current of GOA circuit according to claim 13, further comprising:
restoring an original voltage of the first clock signal and the second signal before restart the GOA circuit.

* * * * *